United States Patent
Kolm et al.

(10) Patent No.: US 9,660,658 B2
(45) Date of Patent: *May 23, 2017

(54) ANALOG-TO-DIGITAL CONVERSION

(71) Applicant: Infineon Technologies AG, Neubiberg (DE)

(72) Inventors: Robert Kolm, Graz (AT); Christoph Boehm, Graz (AT); Maximilian Hofer, Hartberg (AT); Thomas Jackum, Gleisdorf (AT); Stefan Schneider, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/092,416

(22) Filed: Apr. 6, 2016

(65) Prior Publication Data

US 2016/0308544 A1    Oct. 20, 2016

(30) Foreign Application Priority Data

Apr. 14, 2015 (DE) .................. 10 2015 105 704

(51) Int. Cl.
| | |
|---|---|
| *H03M 1/12* | (2006.01) |
| *H03M 1/00* | (2006.01) |
| *G11C 11/412* | (2006.01) |
| *H03M 1/04* | (2006.01) |
| *H03M 1/06* | (2006.01) |

(52) U.S. Cl.
CPC .......... *H03M 1/002* (2013.01); *G11C 11/412* (2013.01); *H03M 1/00* (2013.01); *H03M 1/04* (2013.01); *H03M 1/0675* (2013.01); *H03M 1/12* (2013.01)

(58) Field of Classification Search
CPC .................. H03M 1/12; H03M 1/00

USPC .......... 341/155, 156, 120, 121, 122
See application file for complete search history.

(56) References Cited

U.S. PATENT DOCUMENTS

| | | | |
|---|---|---|---|
| 2008/0297228 A1 | 12/2008 | Kim | |
| 2009/0210184 A1 | 8/2009 | Medardoni et al. | |
| 2011/0038396 A1 | 2/2011 | Yi et al. | |
| 2012/0306553 A1* | 12/2012 | Kim | G04F 10/005 327/158 |
| 2016/0116344 A1 | 4/2016 | Boehm et al. | |

FOREIGN PATENT DOCUMENTS

DE    102014115394 A1    4/2016

OTHER PUBLICATIONS

Office Action, in the German language, from counterpart German Application No. 102015105704.2, dated Feb. 1, 2017, 7 pp.

* cited by examiner

*Primary Examiner* — Joseph Lauture

(74) *Attorney, Agent, or Firm* — Shumaker & Sieffert, P.A.

(57) ABSTRACT

At least one asymmetry element is configured to receive an input signal and is coupled to a first branch of a bi-stable flip-flop comprising the first branch and a second branch. An asymmetry between the first branch and the second branch depends on the input signal. A value indicative of the input signal is determined based on received output signals of a plurality of readout events.

16 Claims, 10 Drawing Sheets

ANALOG-TO-DIGITAL CONVERSION

TECHNICAL FIELD

According to various embodiments, a device and a method are provided. In particular, various embodiments relate to techniques of receiving an input signal and determining a value indicative of the input signal. Various embodiments relate to analog-to-digital conversion.

BACKGROUND

In a wide field of applications, it is necessary to perform analog-to-digital conversion (ADC). Different solutions for ADC exist, including: flash ADC, successive-approximation ADC, ramp-compare ADC, Wilkinson ADC, integrating ADC, and Sigma-Delta ADC.

Different ADC technologies face different drawbacks and limitations. Typically, this results in the different ADC technologies being employed in different fields of technology: e.g., in audio applications, Sigma-Delta ADC is the most common approach, because the speed of ADC is not critical; on the other hand, where there is a need of high accuracy ADC employing Sigma-Delta techniques, typically the required space of the respective circuitry increases and the power consumption is high.

SUMMARY

Therefore, a need exists for advanced techniques of determining a value indicative of an input signal; in particular, a need exists for advanced ADC techniques that alleviate or overcome at least some of the above-mentioned drawbacks. In particular, a need exists for techniques that do not require large-scale circuitry, provide ADC with comparably low power consumption, and, at the same time, allow determining the value indicative of the input signal at a high accuracy.

This need is met by the features of the independent claims. The dependent claims define embodiments.

According to an aspect, a device is provided. The device comprises at least one asymmetry element. The at least one asymmetry element comprises an input interface configured to receive an input signal. The device further comprises at least one cell. Each one of the at least one cell comprises a bi-stable flip-flop comprising a first branch and a second branch. The first branch is coupled to the at least one asymmetry element which causes an asymmetry between the first branch and the second branch. The asymmetry between the first branch and the second branch depends on the input signal. Each one of the at least one cell further comprises an output interface. The output interface is configured to output an output signal indicative of an operational state of the by stable flip-flop. The device further comprises at least one processor. The at least one processor is configured to receive, from each one of the at least one cell via the output interface of the respective cell, the respective output signal in a readout event. The at least one processor is further configured to determine a value indicative of the input signal based on the received output signals of a plurality of the readout events.

According to a further aspect, a method is provided. The method comprises an asymmetry element receiving an input signal. The asymmetry element is coupled with a first branch of the bi-stable flip-flop of at least one cell. This causes an asymmetry between the first branch and a second branch of the bi-stable flip-flop. The asymmetry between the first branch and the second branch depends on the input signal. The method further comprises, at each one of a plurality of readout events: receiving, from a respective one of the at least one cell, an output signal indicative of an operational state of the respective bi-stable flip-flop. The method further comprises determining a value indicative of the input signal based on the received output signals of the plurality of readout events.

It is to be understood that the features mentioned above and features yet to be explained below can be used not only in the respective combinations indicated, but also in other combinations or in isolation, without departing from the scope of the present invention. Features of the above-mentioned aspects and embodiments may be combined with each other in other embodiments.

BRIEF DESCRIPTION OF THE DRAWINGS

The foregoing and additional features and effects of the invention will become apparent from the following detailed description when read in conjunction with the accompanying drawings, in which like reference numerals refer to like elements.

DETAILED DESCRIPTION

Figure 1:
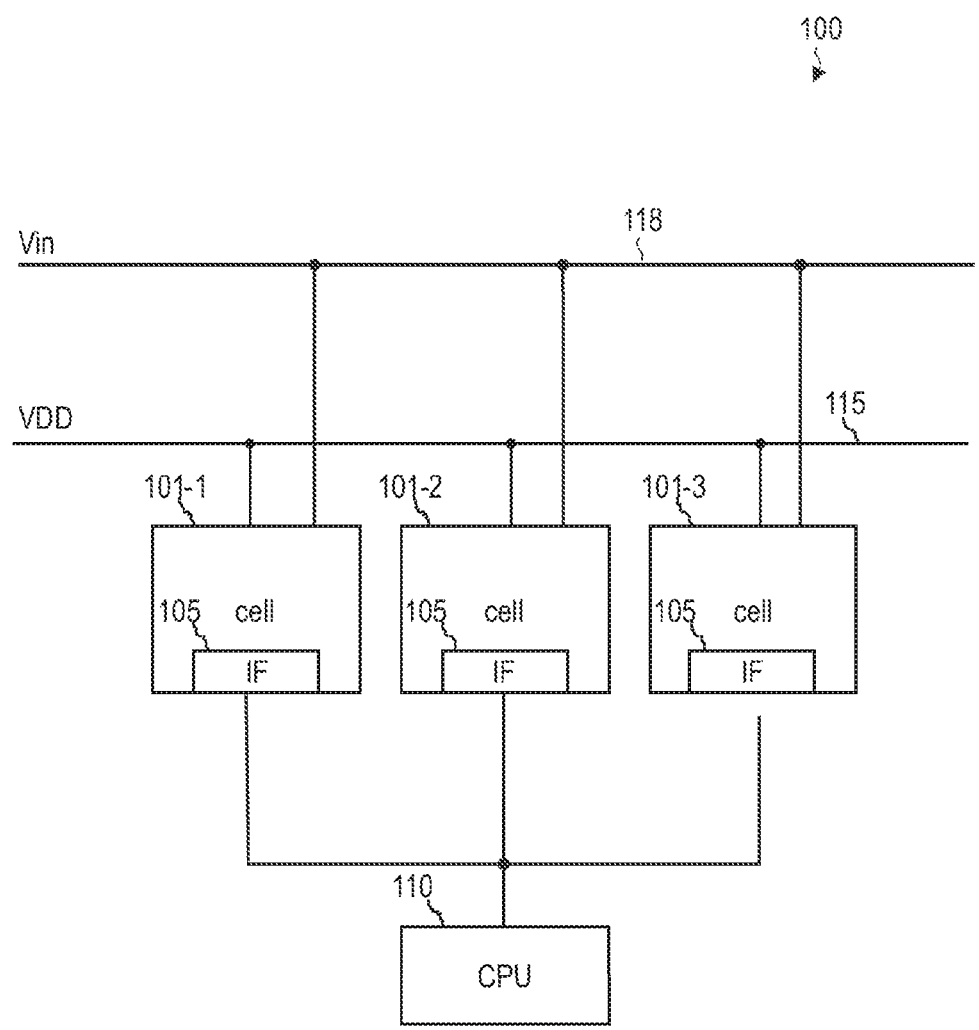
FIG. 1 schematically illustrates a device which comprises a plurality of cells according to various embodiments.

In the following, various embodiments will be described in detail referring to the attached drawings. The embodiments are to be regarded as illustrative examples only and are not to be construed as limiting. For example, while embodiments may be described as comprising a plurality of features or elements, in other embodiments some of these features or elements may be omitted and/or replaced by alternative features or elements. In yet other embodiments, additional features or elements may be provided.

Any connections or couplings shown in the drawings or described herein may be implemented as direct connections or couplings, i.e. connections or couplings without intervening elements, or indirect connections or couplings, i.e. connections or couplings with one or more intervening elements, as long as the general purpose of the connection or coupling, for example to transmit a certain kind of signal and/or to transmit a certain kind of information, is essentially maintained. Connections or couplings may be wire-based connections or couplings or may also be wireless connections or couplings, unless noted otherwise. Furthermore, features from different embodiments may be combined to form additional embodiments.

Hereinafter, techniques of determining a value indicative of an input signal are described. The input signal may be an analog signal. For example, it is possible that the input signal corresponds to an input voltage of certain magnitude; for sake of simplicity, hereinafter reference is primarily made to the input signal being the input voltage. However, generally, the input signal may be another kind of signal, e.g., an input current or the like. The input signal may be time dependent. Then, it is possible that the techniques of determining the value indicative of the input signal are executed anew from time to time to monitor the time dependency. Various techniques as described hereinafter may find particular application in ADC. The value may indicate a digital number that is indicative of the magnitude of the input signal.

The techniques are based on a statistical approach. In various embodiments, influences (i) of the input signal and (ii) of statistical noise on a distribution of operational states in which one or more biased bi-stable flip-flops settle are statistically evaluated. The bi-stable flip-flops can be implemented in various form; in various embodiments the bi-stable flip-flops are implemented by static random access memory (SRAM) cells.

The biased bi-stable flip-flop has a first branch and a second branch where the first branch is coupled to an asymmetry element as the bias. This causes the asymmetry between the first and second branches of the at least one bi-stable flip-flop. According to the techniques described hereinafter, this asymmetry depends on the input signal; e.g., the asymmetry may depend on a magnitude of a voltage of the input signal. E.g., a larger (smaller) magnitude of the input signal may result in a larger (smaller) asymmetry between the first branch and the second branch of the bi-stable flip-flop.

These techniques rely on the finding that, by selectively providing the coupling of the asymmetry element to the first branch of the first and second branches of the bi-stable flip-flop, the structural asymmetry caused by the asymmetry element causes an energy difference for the two operational states of the bi-stable flip-flop. Thus, also the operational states are asymmetric with respect to each other. E.g., thermal activation energy or thermal noise causes the bi-stable flip-flop to settle at the higher energy operational state at a certain probability; this probability, in turn, depends on the asymmetry and, therefore, on the input signal.

Thus, generally, the probability of the bi-stable flip-flop settling in a given operational state depends on (i) the asymmetry between the operational states and (ii) the noise present. The statistical approach evaluates how often the bi-stable flip-flop settles at a given operational state to determine the value indicative of the input signal.

In particular, hereinafter various techniques are described that allow discriminating between influences on the statistics caused by the (i) asymmetry—and therefore of the input signal—on the one hand side, and, on the other hand side, caused by (ii) the noise. Then, the value indicative of the input signal may be determined more accurately.

The statistics may be achieved by considering one or more readout events per bi-stable flip-flop for a plurality of flip-flops (ensemble of bi-stable flip-flops). Alternatively or additionally, it is possible to achieve the statistics by considering a plurality of readout events for a single bi-stable flip-flop. Such dependencies of the number of readout events on the number of readout events per bi-stable flip flop can be formally illustrated in a so-called readout matrix.

In particular in the first case as mentioned above, it is possible that another significant contribution to the noise originates from manufacturing spread between the plurality of bi-stable flip-flops and/or the asymmetry elements. The manufacturing spread can originate from imperfections in the manufacturing process and resulting variations from cell to cell. If a sufficiently large number of bi-stable flip-flops is employed, the manufacturing spread typically shows a Gaussian distribution. The manufacturing spread also influences a probability that a certain fraction of an ensemble of bi-stable flip-flops settles in a given operational state.

Such techniques as mentioned above allow determining the value indicative of the input signal at a comparably high accuracy. Further, it is possible to shrink the area required for implementing the ADC circuitry; relying on smaller fabrication technologies becomes possible. These techniques further allow implementing high accuracy ADC circuitry in silicon technology without the need for external components, i.e., allow for an on-chip design. In particular, various embodiments offer the possibility of increasing the accuracy with decreasing size of fabrication technology.

In FIG. 1, an ADC device 100 is shown. The ADC device 100 comprises an ensemble of three cells 101-1, 101-2, 101-3. Each one of the three cells 101-1, 101-2, 101-3 is coupled with a common supply line 115 of the ADC device 100; a high supply voltage VDD is applied to the supply line 115. It is possible that each one of the three cells 101-1, 101-2, 101-3 is coupled with a further common supply line (not shown in FIG. 1) to which a low supply voltage VSS may be applied. Each one of the three cells 101-1, 101-2, 101-3 is coupled with an input line 118; an input voltage Vin is applied to the input line 118. The ADC device 100 allows determining a value indicative of the input voltage Vin.

Each one of the three cells 101-1, 101-2, 101-3 comprises an interface 105 which connects the respective cell 101-1, 101-2, 101-3 to a processor 110 of the ADC device 100. Via the interface 105, the processor 110, at a readout event, receives an output signal from a respective one of the cells 101-1, 101-2, 101-3. E.g., the processor 110 can receive three output signals, one from each one of the cells 101-1-101-3, in three readout events. It is also possible that the processor receives six output signals, two from each one of the cells 101-1-101-3, in six readout events, etc. Generally, a number of readout events is not limited; it is possible that the processor 110 serially receives a plurality of output signals in a series of readout events.

While in FIG. 1 a scenario is shown where the ADC device 100 comprises an ensemble of three cells 101-1, 101-2, 101-3, it is also possible that according to further embodiments the ADC device 100 comprises a larger number or a smaller number of cells 101-1, 101-2, 101-3, e.g., a single cell.

The processor 110 is configured to determine the value indicative of the input voltage Vin employing the statistics provided by a plurality of readout events. Such techniques that rely on the statistics provided by the plurality of readout events are explained in greater detail hereinafter. These techniques rely on each one of the cells 101-1-101-3 comprising a bi-stable flip-flop (not shown in FIG. 1). The bi-stable flip-flop has two operational states. The output signal from a particular one of the cells 101-1-101-3 and received by the processor 110 in a respective readout event is indicative of the operational state of the respective bi-stable flip-flop. Based on the received output signals for the plurality of readout events, the processor 110 determines the value. Because the plurality of output signals indicate a plurality of operational states of the bi-stable flip-flops of the various cells 110-1-110-3, statistics on the operational states for the plurality of readout events is available. This statistics is used to determine the value indicative of the input voltage Vin. E.g., the processor 110 can determine the value based on a distribution of the operational states indicated by the output signals.

In FIG. 1, a scenario is shown where a single processor 110 is provided. However, it should be understood that, instead of relying on a single processor 110, a plurality of processors 110, e.g., multi-core processors could be implemented. Shared computing is possible.

Figure 2:
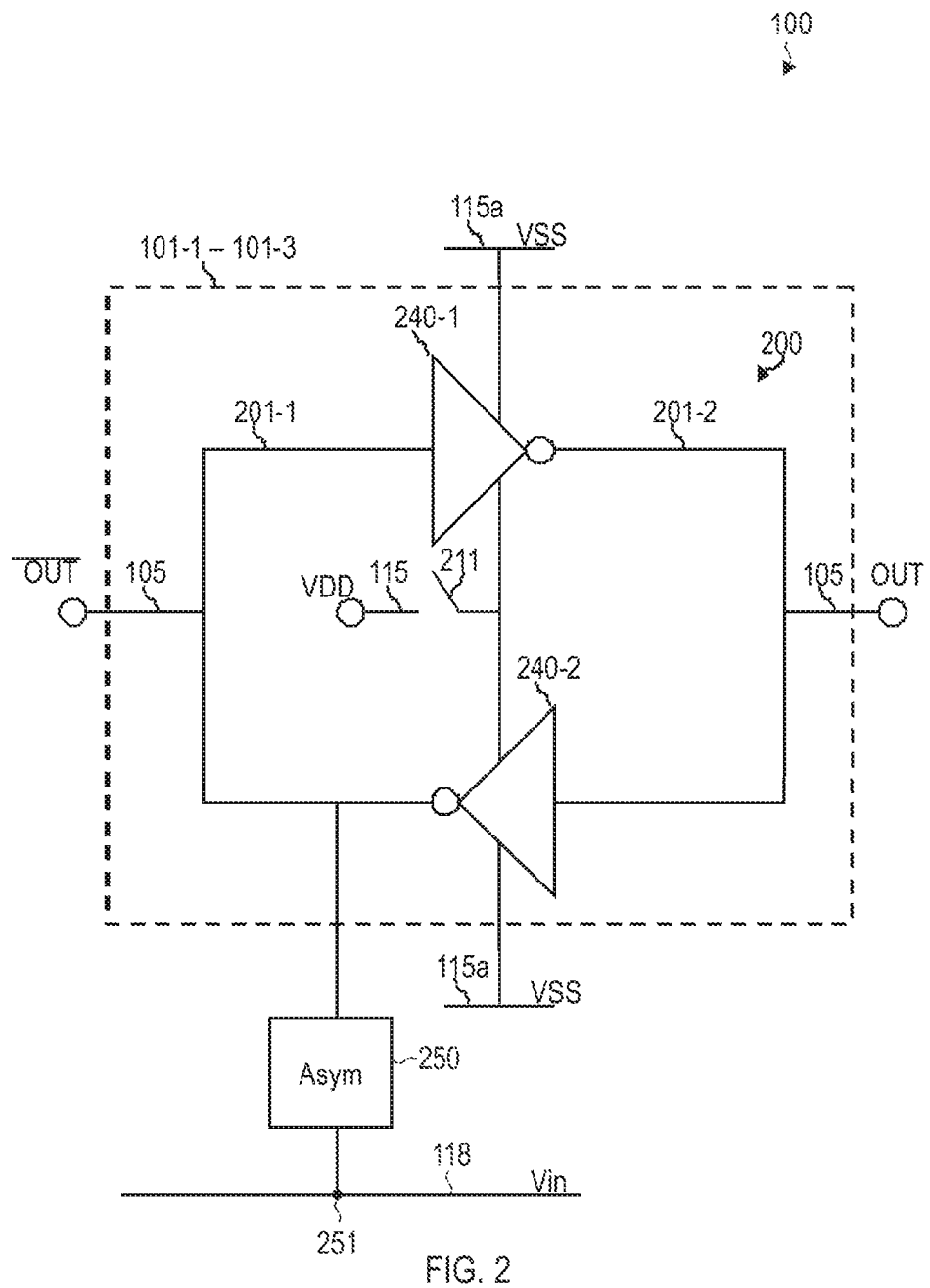
FIG. 2 schematically illustrates a cell of the device of FIG. 1 in greater detail according to various embodiments, wherein the cell comprises a bi-stable flip-flop having first and second branches, wherein the first branch is coupled to an asymmetry element which causes an asymmetry between the first branch and the second branch.

In FIG. 2, one of the cells 101-1, 101-2, 101-3 is illustrated at greater detail. The remaining cells 101-1, 101-2, 101-3 can be implemented accordingly. As can be seen from FIG. 2, the cells 101-1, 101-2, 101-3 comprise the bi-stable flip-flop 200 having a first branch 201-1 and a second branch 201-2.

In this scenario of FIG. 2, the bi-stable flip-flop 200 is implemented by means of two inverters 240-1, 240-2. The first branch 201-1 comprises the first inverter 240-1; the second branch 201-2 comprises the second inverter 240-2. A switch 211 is provided which is configured to selectively couple the first branch 201-1 and the second branch 201-2 of the bi-stable flip-flop via the common supply line 115. This is done to program the cells 101-1-101-3 at a preparation event. At the preparation event, the high supply voltage VDD is applied to the first branch 201-1 and to the second branch 201-2 via the supply line 115 and via the switch 211. The inverters 240-1, 240-2 are also coupled to a further common supply line 115a to which the low supply voltage VSS is applied. The low supply voltage VSS is typically at ground.

The first branch 201-1 is coupled to an asymmetry element 250 and, via the asymmetry element 250, to the input line 118. The asymmetry element 250 causes an asymmetry between the first branch 201-1 and the second branch 201-2. The asymmetry is of structural kind. The asymmetry causes an energy difference between the two operational states of the bi-stable flip-flop 200. This energy difference depends on the input voltage Vin. Thus, the asymmetry is also of energetic kind. The asymmetry depends on the input voltage Vin.

The preparation event is symmetrically with respect to the two operational states of the bi-stable flip-flop 200. Due to the asymmetry caused by the asymmetry element 250, the bi-stable flip-flop, after the preparation event has ended and the switch 211 is controlled to be in its open position again, the bi-stable flip-flop 200 is likely to settle the particular one of the two operational states which is energetically favorably. However, due to the influence of thermal noise, the asymmetry can be overcome and, with a certain probability, the bi-stable flip-flop 200 settles in the other one of the two operational states, i.e., the particular one of the two operational states which is energetically unfavorably.

Above, a scenario has been illustrated where the likelihood of a given bi-stable flip-flop 200 settling in a given one of the two operational states depends on thermal noise. Another scenario is that due to manufacturing spread the inverters 240-1, 240-2 are not completely alike; then, due to the manufacturing spread, a further asymmetry between the first branch 201-1 and the second branch 201-2 results.

In the scenario of FIG. 2, a single cell 101-1-101-3 is shown. Generally, it is possible that manufacturing imperfections vary from cell to cell 101-1-101-3; in particular, such a variation of the imperfection may be statistical. Then, from cell to cell 101-1-101-3, the likelihood of the respective cell 101-1-101-3 settling in a given one of the two operational states varies statistically. Such a scenario is also referred to as manufacturing spread.

The cells 101-1, 101-2, 101-3 further comprise an interface 105. In the implementation of FIG. 2, the interface 105 comprises two outputs. Via the two outputs, it is possible to read out the voltage at the first branch 201-1 and the voltage at the second branch 201-2 as the output signal. Each one of these voltages may define the two operational states of the bi-stable flip-flop 200. Thus, generally, it is also possible to implement the interface 105 having only a single output. E.g., the voltages may be defined with respect to the high supply voltage VDD and/or the low supply voltage VSS.

Thus, in general, the interface 105 is configured to output the output signal which is indicative of the operational state of the bi-stable flip-flop 200. E.g., the interface 105 may be configured to output either the voltage in the first branch 201-1 or the voltage in the second branch 201-2.

Via the interface 105, the output signal can be received by the processor 110 (not shown in FIG. 2) in a readout event. The output signal is indicative of the operational state in which the bi-stable flip-flop 200 has settled at the time the readout event is executed.

As mentioned above, the processor 110 is configured to determine the value based on the received output signals of a plurality of readout events. Based on the statistics of the plurality of readout events, it is possible to determine the value. In particular, the processor 110 can be configured to determine the value based on a distribution of the operational states indicated by the output signals of the plurality of readout events. The distribution is influenced by the input voltage via the asymmetry element 250. The distribution of the operational states is further influenced by thermal noise acting on the bi-stable flip-flop 200 at the temperature. When a plurality of readout events based on output signal received from the plurality of cells 101-1-101-3 is considered, it is possible that, both, thermal noise, as well as manufacturing spread contribute to the distribution of the operational states.

Figure 3A:
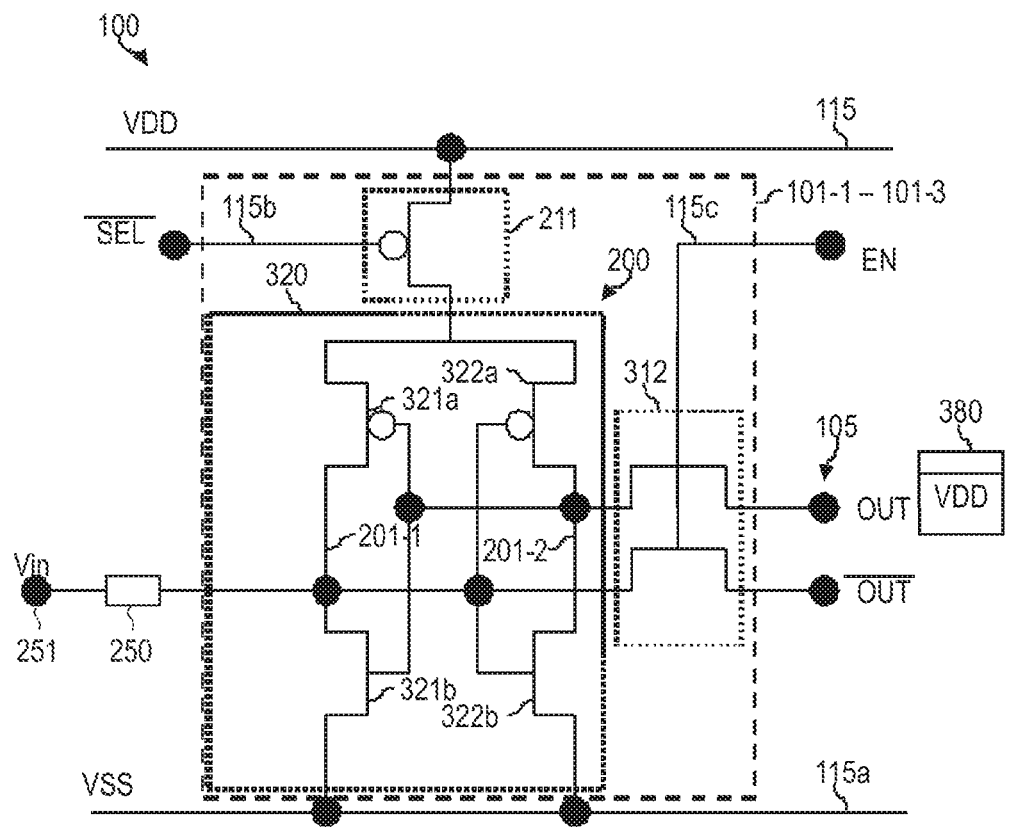
FIG. 3A schematically illustrates a cell of the device of FIG. 1 in greater detail according to various embodiments, wherein the cell comprises a bi-stable flip-flop having first and second branches, wherein the first branch is coupled to an asymmetry element which causes an asymmetry between the first branch and the second branch, wherein the asymmetry element is implemented by an Ohmic resistance.
Figure 3B:
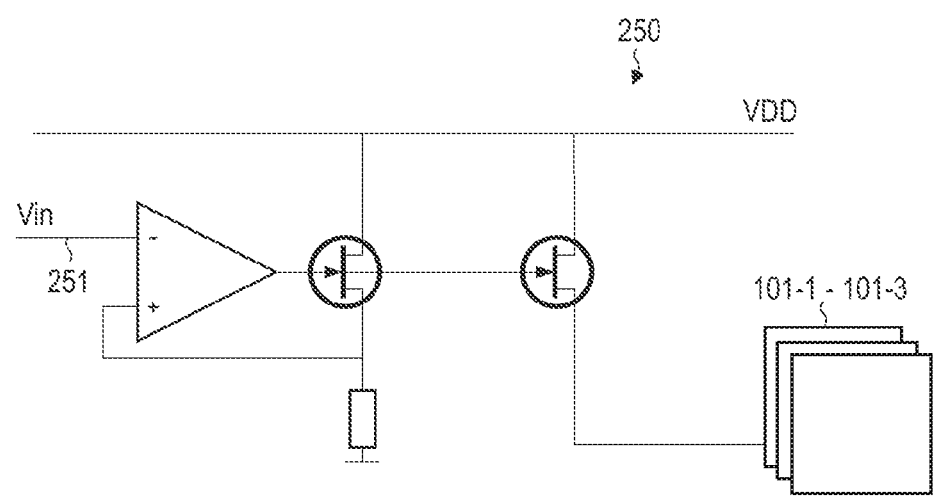
FIG. 3B illustrates the asymmetry element being implemented as a current source.

In FIG. 3A, a further implementation of the cells 101-1-101-3 is shown. The implementation of FIG. 3 is based on a SRAM cell 320 which forms the bi-stable flip-flop 200. The SRAM cell 320 comprises five transistors 321a, 321b, 322a, 322b, 323. The transistors 321a, 321b form the first branch 201-1 of the bi-stable flip-flop 200. The transistors 322a, 322b form the second branch 201-2 of the bi-stable flip-flop 200. As can be seen from FIG. 3, the first branch 201-1 of the bi-stable flip-flop 200 is coupled to the asymmetry element 250. In the scenario of FIG. 3A, the asymmetry element 250 is implemented by an Ohmic resistor.

Hereinafter, details of the implementation of the scenario of FIG. 3A are illustrated. The first branch 201-1 comprises a first transistor 321a being a PMOS 321a having a source, a drain, and a gate, as well as the second transistor 321b being a NMOS 321b having a source, a drain, and a gate. The second branch 201-2 of the bi-stable flip-flop 200 comprises the first transistor 322a being a PMOS 322a having a source, a drain, and a gate, as well as the second transistor 322b being an NMOS 322b having a source, a drain, and a gate.

The drain of the PMOS 321a of the first branch 201-1 is coupled to the drain of the NMOS 321b of the first branch 201-1 and further coupled to the gate of the PMOS 322a of the second branch 201-2 and further coupled to the gate of the NMOS 322b of the second branch 201-2. The drain of the PMOS 322a of the second branch 201-2 is coupled to the drain of the NMOS 322b of the second branch 201-2 and further coupled to the gate of the PMOS 321a of the first branch 201-1 and further coupled to the gate of the NMOS 321b of the first branch 201-1. The asymmetry element 250, in the scenario of FIG. 3, is the resistor coupled to the first branch 201-1. The asymmetry caused by the asymmetry element 250 is tunable depending on the input voltage.

In the scenario of FIG. 3A, the two operational states of the bi-stable flip-flop 200 correspond to a voltage at one of the two ports of the interface 105 equalling either the high supply voltage VDD applied via the common supply line 115 at the preparation event, or the low supply voltage VSS at the further common supply line 115a. The output signal 380 may indicate the respective voltage.

In the scenario of FIG. 3A, an implementation of the asymmetry element 250 in the form of the resistor coupled in to the first branch 201-1 has been shown. In general, various implementations of the asymmetry element 250 are conceivable. E.g., the asymmetry element may be a transistor; a current source (cf. FIG. 3B); a field-effect transistor; an Ohmic resistance; and/or an inductance.

Figure 3C:
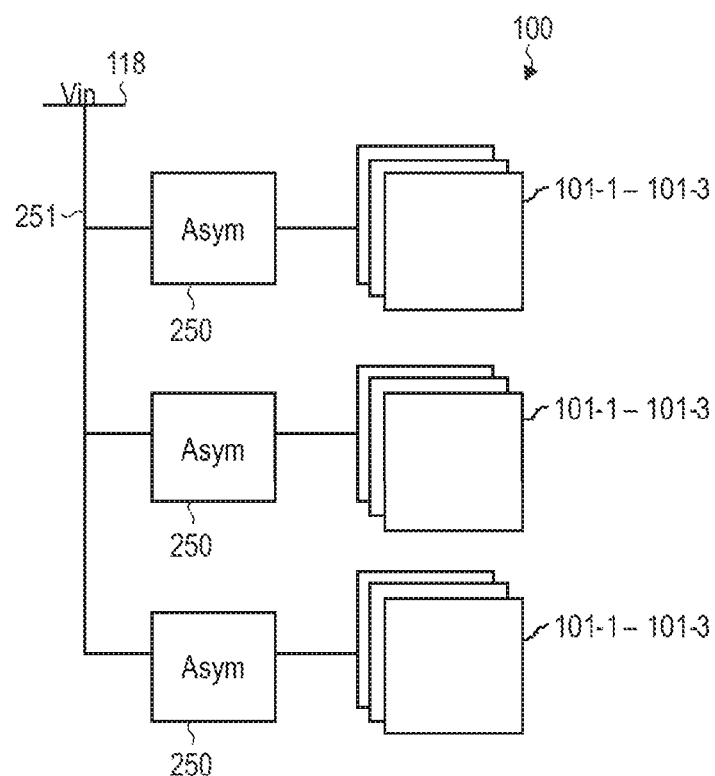
FIG. 3C illustrates a plurality of cells of the device of FIG. 1 and a plurality of asymmetry elements comprising an input interface configured to receive an input signal.

Generally, it is possible that there is one asymmetry element 250 per cell 101-1-101-3. E.g., in such a scenario, it is possible that the asymmetry element 250 is integrated into the first branch 201-1. However, as shown in FIG. 3C, it is also possible that the ADC device 100 comprises a first number of cells 101-1-101-3 and comprises a second number of asymmetry elements 250, wherein the first number is larger than the second number. E.g., in the scenario of FIG. 3C, the ADC device 100 comprises nine cells 101-1-101-3, but only three asymmetry elements 250. Generally, a ratio between the first number of cells 101-1-101-3 and the second number of asymmetry elements 250 is variable.

By reusing asymmetry elements 250 for a plurality of cells 101-1-101-3, it becomes possible to reduce the number of circuitry required to build the ADC device 100 and integrate the ADC device 100 in smaller space.

As can be seen from FIG. 3C, each one of the asymmetry elements 250 is fixedly coupled via the respective input interface 251 to the input line 118 at which the input voltage Vin is applied.

Figure 3D:
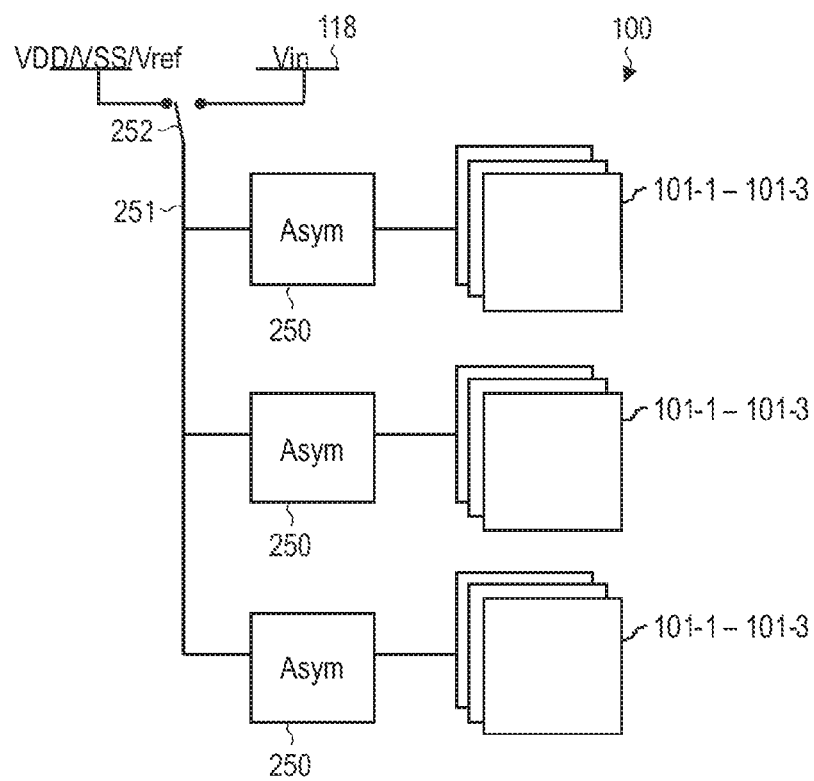
FIG. 3D illustrates a plurality of cells of the device of FIG. 1 and a plurality of asymmetry elements comprising an input interface, the input interface comprising a switch, wherein, depending on a state of the switch, the input interface receives the input signal or a reference signal.

In the scenario of FIG. 3D, the input interface 251 of the asymmetry elements 250 comprises a switch 252. Here, the asymmetry elements 250 can be selectively coupled to the input line 118. The input interface 251 is configured to selectively receive the input voltage Vin or any one of at least one reference signal depending on the state of the switch 252. Thus, while in the scenario of FIG. 3D, only two states of the switch 252 are shown, generally it is possible that the switch 252 can be operated in a larger number of states depending on the number of reference signals to be received by the input interface 251. Generally, the at least one reference signal can be selected from the group comprising: the high supply voltage VDD; the low supply voltage VSS; a predefined signal Vref.

By configuring the input interface 251 so that the input interface 251 can selectively receive the input voltage Vin and the at least one reference signal VDD, VSS, Vref, it becomes possible to perform a calibration of the determining of the value indicative of the input voltage Vin. In particular, said calibration can be with respect to thermal noise and/or manufacturing spread.

Figure 4:
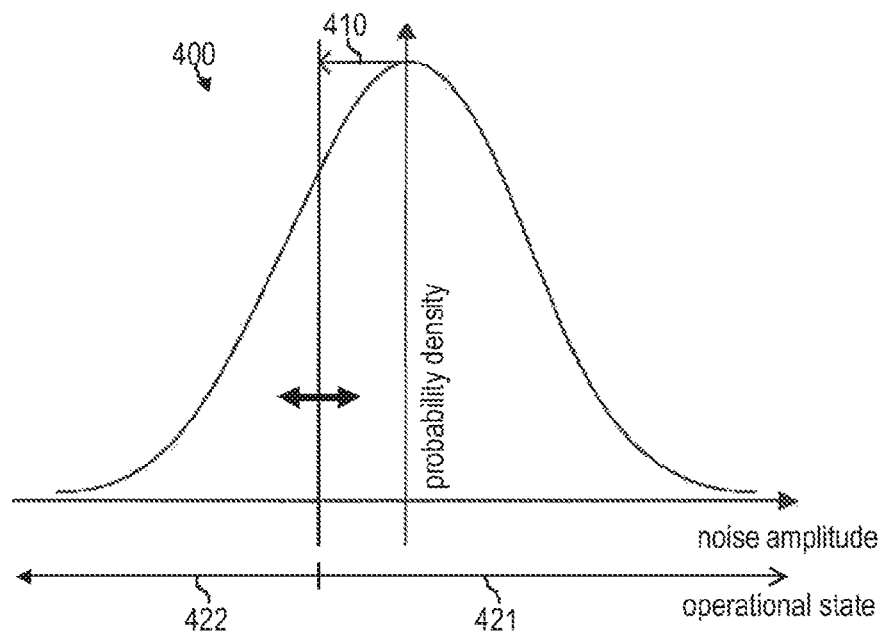
FIG. 4 illustrates schematically determining of a value indicative of the input signal employing thermal noise according to various embodiments, wherein a distribution of operational states of the bi-stable flip-flops for a given temperature is shown.

Above, techniques of implementing the ADC device 100 have been primarily discussed. Hereinafter, the underlying concepts of determining the value indicative of the input voltage Vin are illustrated in greater detail. In FIG. 4, the Gaussian probability density function of thermal noise is shown. This distribution defines the probability of the final operational states 421, 422.

As mentioned above, the asymmetry element 250 causes an asymmetry 410 in terms of energy between the operational states 421, 422. This asymmetry 410 caused by the asymmetry element 250 is schematically illustrated in FIG. 4. It shifts the distribution 400 to higher (lower) probabilities of the first operational state 421 (second operational state 422).

In detail, the thermal noise or thermal activation energy causes a non-zero probability for the bi-stable flip-flop 200 to be, at the readout event, in the second operational state 422. Due to the asymmetry 410, a probability (the area underneath the curve right of the zero-axis in FIG. 4) for the bi-stable flip-flop 200 to be in a first operational state 421 is larger than the probability for the bi-stable flip-flop 200 to be in the second operational state 422. This is because the center of the distribution 400 is shifted due to the asymmetry 410.

In other words, at the given temperature, the likelihood of the respective bi-stable flip-flop 200 being in the first operational state 421 or the second operational state 422 depends on the asymmetry 410—and, therefore, depends on the input voltage Vin. Because of this, based on the output signals 380 of the plurality of readout events, it is possible to determine the value indicative of the input voltage Vin.

Figure 5:
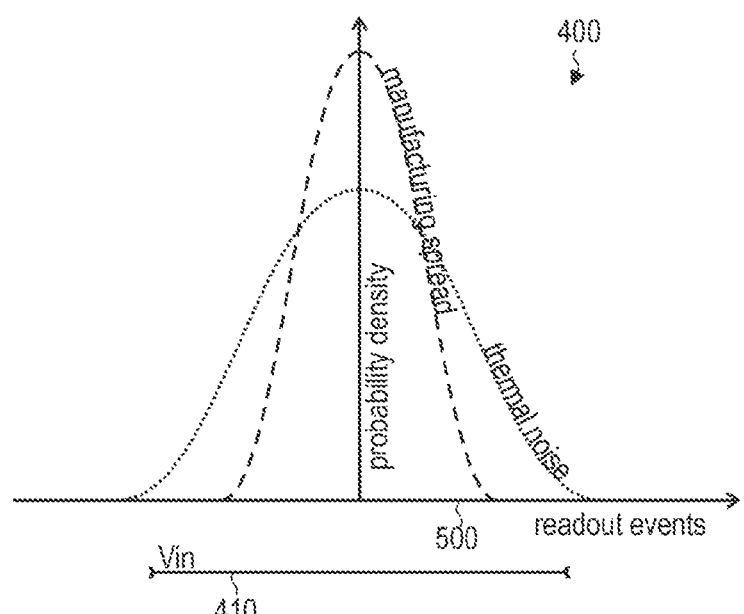
FIG. 5 illustrates schematically determining of a value indicative of an input signal employing thermal noise and manufacturing spread of a plurality of cells according to various embodiments, wherein distributions of operational states due to the thermal noise and the manufacturing spread are shown.

As mentioned above, typically, the distribution 400 of the operational states 421, 422 is caused by thermal noise acting on the bi-stable flip-flops 200 of the cells 101-1-101-3, as well as by manufacturing spread. Generally, a width of the distribution 400 due to thermal noise and due to manufacturing spread can vary, as illustrated in FIG. 5. In FIG. 5, the dotted line illustrates a contribution to the distribution 400 that is due to thermal noise; the dashed line illustrates a contribution to the distribution 400 that is due to manufacturing spread.

As can be seen from FIG. 5, a variation of the asymmetry 410 due to a variation of the input voltage Vin, in a sensitivity range of the ADC device 100, is in the same order of magnitude as the width of the contributions of thermal noise and manufacturing spread to the distribution 400. Generally, for a given sensitivity range of the ADC device 100, it is possible to appropriately dimension the asymmetry element 250 such that the variation of the asymmetry 410 is in the same order of magnitude as the width of the distribution 400. Preferably, the asymmetry element 250 is dimensioned so that the ADC device 100 can be operated in a range of the operation temperature between 70 K to 470 K, preferably in a range of the operation temperature between 170 K to 420 K, more preferably in a range of the operation temperature between 220 K to 370 K.

Generally, it is not required that a magnitude of the input voltage Vin is limited to the high supply voltage VDD and/or the low supply voltage VSS. E.g., if the high supply voltage VDD is at 1.2 V, it is possible that the input voltage Vin varies between −5 V and +5 V.

For sake of simplicity, hereinafter it is assumed that the contribution of the manufacturing spread to the distribution 400 of operational states 421, 422 can be neglected if compared to the contribution of thermal noise to the distribution 400. However, generally, it is possible that the techniques as explained hereinafter are likewise applied to the scenario as discussed above with respect to FIG. 5, i.e., where, both, significant contributions from thermal noise and manufacturing spread to the distribution 400 of present.

In such a scenario, the full-width at half maximum (FWHM) of the distribution 400 depends on the temperature 500. The larger (smaller) the temperature 550, the larger (smaller) the thermal noise, the larger (smaller) the FWHM of the distribution 400.

Figure 6:
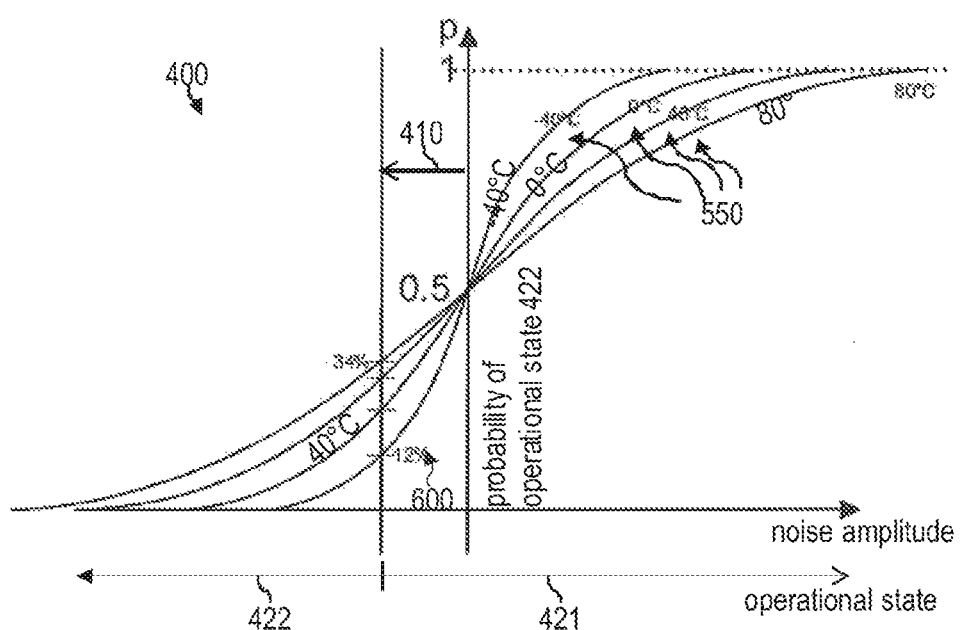
FIG. 6 illustrates schematically determining of the value indicative of the input signal employing thermal noise according to various embodiments, wherein cumulative density functions of the distributions of the operational states at various temperatures are shown.

In FIG. 5, multiple cumulative distributions 400 are exemplarily shown for four temperatures 550, namely −40° C., 0° C., 40° C. and 80° C. As can be seen from FIG. 5, generally, the likelihood of a bi-stable flip-flop 200 ending up in the first operational state 421 depends on, both, the temperature 550 and the asymmetry 410 caused by the input voltage 410. Thus, generally, it can be required to discriminate between influences on the distribution 400 from (i) the input voltage Vin and (ii) the temperature 550. Generally, the processor 110 can determine the noise contribution to received output signals 380 in the above mentioned calibration. To explain these techniques, first, with reference to FIG. 6 it is assumed that the input voltage Vin remains constant and causes a fixed value of the asymmetry 410:

Then, for the temperature 550 amounting to −40° C., the probability of the bi-stable flip-flop 200 being in the first operational state 421 at the readout event is illustrated in FIG. 5 to amount to 88%. Further, the probability of the bi-stable flip-flop 200 being in the second operational state 422 is shown for this temperature 550 of −40° C. to amount to 12%. The two probabilities typically sum up to 1. Thus, it is expected that for a number 600 of hundred readout events 700, eighty-eight readout events 600 provide an output signal 380 indicating the first operational state 421. As can be seen from FIG. 5, for higher (lower) temperatures 540, the probability of the bi-stable flip-flop 200 being in the second operational state 421 at the readout event is lower (higher).

Thus, by counting the number 600 of readout events which correspond to the bi-stable flip-flop 200 being in the first operational state 421, it is possible to determine the temperature 550—in a scenario where the asymmetry 410 is known. Likewise, in a scenario where the temperature is known, by counting the number 600 of readout events which correspond to the bi-stable flip-flop 200 being in the first operational state 421, it is possible to determine the asymmetry 410 and, thereby, the input voltage Vin. These findings are exploited in determining of the value indicative of the input voltage Vin.

It is possible that the processor 110 determines the number 600 of output signals 380 which correspond to the same operational state 421, 422 of the bi-stable flip-flop 200. The ADC device 100 can comprise a memory which is configured to store a look-up table. The look-up table can include a plurality of links between a candidate number of output signals 380 which correspond to the same operational state 421, 422 of the bi-stable flip-flop 200 and an associated value indicative of the input voltage Vin. E.g., each link may specify a different associated value indicative of the input voltage Vin depending on the particular temperature 550.

In one embodiment, operational specifications of the ADC device 100 may be limited to a comparably narrow range of temperatures 550. Then, it may not be required to determine the temperature 550 in order to accurately determine the value indicative of the input voltage Vin. A higher operational range may be obtained if the temperature 550 is determined.

Here, the processor 110 can, in a first step, determine the temperature 550 and, in a second step, determine the value indicative of the input voltage Vin. Once the temperature 550 is known, it is possible to select the particular distribution 400 that determines the noise contribution to the received output signals 380 (cf. FIG. 6).

Generally, various techniques of determining the temperature 550 are conceivable. In a simple scenario, the ADC device 100 may comprise a temperature sensor. The processor 110 can then be configured to determine the temperature 550 based on a sensor signal received from the temperature sensor. The temperature can then be taken as a reference value when determining the asymmetry 410—e.g., making reference to FIG. 6, the temperature 550 can allow selecting the appropriate distribution 400 so that the number of readout events corresponding to the first operational states 421 correctly denotes the asymmetry 410.

Another technique of determining the temperature 550 relies on the above-mentioned calibration. E.g., the reference signal VDD, VSS, Vref of known magnitude may be applied to the input interface 251 of the asymmetry elements 250 by operating the switch 252 in a corresponding state; this results in a well-defined asymmetry 410. Then, the corresponding further readout events allow the processor 110 to determine the temperature 550. E.g., it is possible that the processor 110 receives, from each one of the cells 101-1-101-3, a respective further output signal in a further readout event when the switch 252 is in a state where the input interface 251 receives any one of the at least one reference signal VDD, VSS, Vref. Correspondingly, when the processor 110 receives the output signal 380 in the readout event, the switch 252 can be in a state where the input interface 251 receives the input voltage Vin. It is then possible that the processor 110 is configured to determine the value indicative of the input voltage Vin further based on the received further output signals of a plurality of the further readout events as a reference value. The processor 110 can be configured to determine the temperature 550 by executing a look-up of the determined number 600 of output signals 380 which correspond to the same operational state 421, 422 of the bi-stable flip-flop 200 in a plurality of links of a further look-up table.

In a further scenario, it may not be required to quantify the temperature 550 in order to accurately calibrate the ADC device 100. E.g., this may be the case where the value indicates whether the input voltage Vin is equal to or differs from a predefined signal Vref. Here, the ADC device 100 can be implemented to operate as a single-bit ADC. In this regard, the processor 110 can determine, based on the received output signals 380 of the plurality of readout events, a first number of output signals 380 which correspond to a given operational state 421, 422 of the bi-stable flip-flops 200 of the cells 101-1, 101-2, 101-3. The processor 110 can further determine, based on the received further output signals of the plurality of further readout events, a second number of further output signals which correspond to the given operational state 421, 422 of the bi-stable flip-slops 200 of the cells 101-1, 101-2, 101-3. The processor can compare the first number with the second number. If the first number equals (differs) from the second number, it can be concluded that the input voltage Vin equals (differs) from the predefined signal Vref.

Thus, as shown above, it is possible to execute the calibration to determine the temperature 550. By relying on a plurality of reference values, it is also possible to determine the influence of the temperature 550, as well as the influence of the manufacturing spread. In particular in the scenario as discussed above with respect to FIGS. 3C, 3D, where a given asymmetry element 250 is shared between a plurality of cells 101-1-101-3, it can be desirable to accurately determine the influence of the manufacturing spread of the properties of the asymmetry element 250 itself.

Figure 7A:
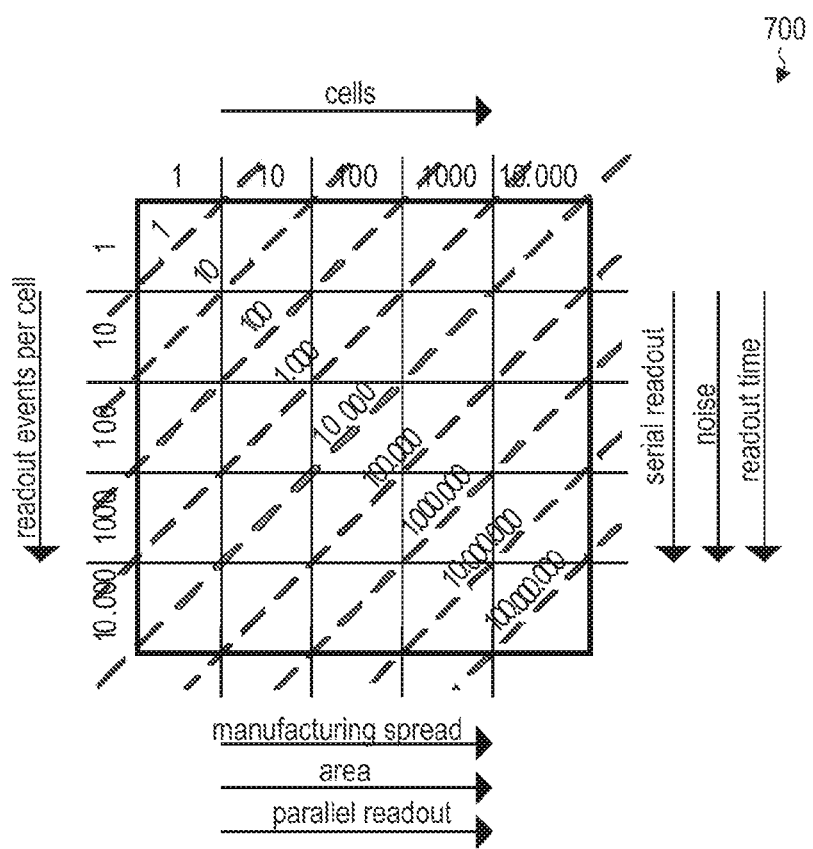
FIG. 7A illustrates a dependency of said determining of the value indicative of the input signal on a number of readout events.

As will be appreciated from the above, the techniques described herein depend on a statistical approach. Typically, to obtain a good accuracy when determining the value indicative of the input voltage Vin, it can be desirable to execute a large number of readout events. In FIG. 7A, the so-called readout matrix is shown. Diagonals in FIG. 7A correspond to a certain number of readout events 700. A larger number of readout events 700 can be obtained by increasing the number of cells 101-1-101-3 (at a given number of readout events per cell; shown at the horizontal axis in FIG. 7 a) and/or by increasing the number readout events per cell 101-1-101-3 (at a given number of cells 101-1-101-3; shown by the vertical axis in FIG. 7A). E.g., employing a single cell 101-1-101-3 with 10,000 readout events per cell gives the same total number of readout events 700 as employing 10,000 cells 101-1-101-3 with one readout event per cell.

Generally, a larger number of cells 101-1-101-3 results in a larger manufacturing spread and higher area demands for implementing the ADC device 100. At the same time, it becomes possible to receive the output signals 380 of the various cells 101-1-101-3 at least partly in parallel, i.e., it becomes possible to employ parallel readout. This allows decreasing the measurement time required to determine the value indicative of the input voltage Vin. On the other hand, where it is relied upon a smaller number of cells 101-1-101-3, it can become necessary to serially readout one and the same cell 101-1-101-3 a plurality of times; then, the measurement time required to determine the value indicative of the input voltage Vin may increase. Further, if a smaller number of cells 101-1-101-3 is employed, the influence of the manufacturing spread may deviate from a Gaussian distribution.

Generally, a certain amount of energy may be consumed per readout event. In a first approximation, the total amount of energy may not depend on the position within the readout matrix of FIG. 7A. However, it is also possible that in case of serial readout (left-hand side of the readout matrix of FIG. 7A), the total power consumption is comparably lower, because the energy is distributed over a longer measurement time.

Hereinafter, a dependency of the manufacturing spread on the size of a cell 101-1-101-3 is exemplarily explained. In current manufacturing technology, the size of a typical SRAM cell is approximately 140 $F^2$. A typical magnitude of the threshold voltage's manufacturing spread amounts to 5 mV/area$^2$. Since for smaller technologies the size of the cell 101-1-101-3, e.g., an SRAM cell, shrinks, the mismatch within the cells 101-1-101-3 increases. This generally increases the performance of the ADC device 100. Further, while ADC devices according to reference implementations typically require a certain area to obtain a given performance with low influence of the minimum size, the techniques as explained herein provide a higher performance with decreasing minimum size of the technology. In particular, a ratio of increase in performance increases exponentially over decrease in size.

As can be seen from the above, it is possible to control the influence of the manufacturing spread and the thermal noise on the determining of the value indicative of the input voltage Vin. E.g., if the thermal noise is small, it may not be advantageous to read out one and the same cell 101-1-101-3 a plurality of times; this is because this will deterministically result in the corresponding bi-stable flip-flop 200 ending up in the same operational state 421, 422 in all readout events. On the other hand, if the influence of thermal noise is high, then an influence of the input voltage Vin on the operational state 421, 422 in which the corresponding bi-stable flip-flop 200 settles can become insignificant (see FIG. 5 and consider a scenario where a width of the distribution 400 due to thermal noise is much larger than the variation range of the asymmetry 410). In such a case, it may be required to increase the total number of readout events 700 or appropriately re-dimension the asymmetry element 250.

As can be seen from the above, an accuracy in determining the value indicative of the input voltage Vin is flexibly scalable. For example, in a situation where there is a need for high accuracy, it is possible to base the determining of the value on a comparably large number of readout events 700. On the other hand, in a situation where there is a need for low power consumption, it is possible to base the determining of the value on a comparably small number of readout events 700. Thus generally, it is possible that the processor 410 determines a number of readout events 700 depending on at least one of a power consumption and an accuracy of the determining of the value indicative of the input voltage Vin.

Figure 7B:
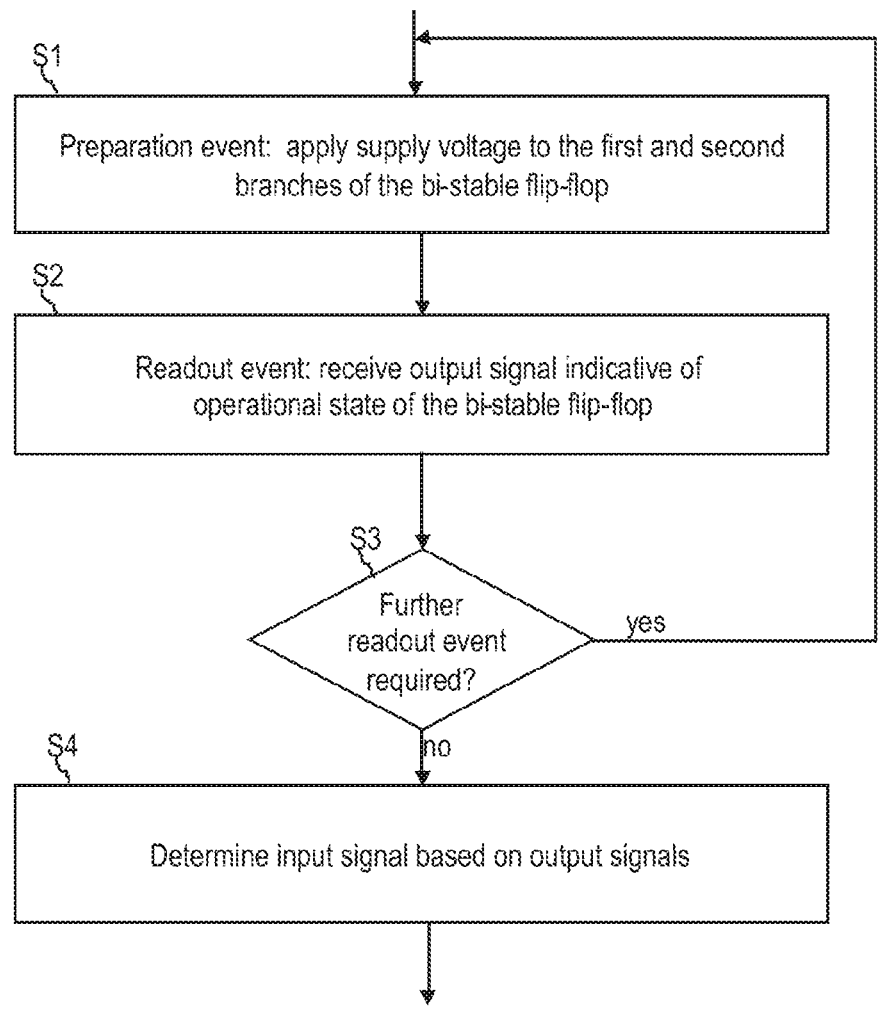
FIG. 7B is a flowchart of a method of determining the value indicative of the input signal according to various embodiments.

In FIG. 7B, a flowchart of a method according to various embodiments is illustrated. At S1, a preparation event occurs. Here, the high supply voltage VDD is applied to the first and second branches 201-1-201-2 of the bi-stable flip-flop 200 of a particular cell 101-1-101-3. For this, it is possible to control the switch 211 to be in a closed position, e.g., for a pre-defined duration.

Next, S2 is executed. S2 can be executed at a pre-defined time after S1 has been executed. This allows the bi-stable flip-flop 200 to settle in one of the two operational states 421, 422. At S2, a readout event 700 of the bi-stable flip-flop 200 which has been prepared at S1 occurs. At S2, the output signal 380 is received by the processor 110. The output signal 380 is indicative of the operational state 421, 422 of the bi-stable flip-flop 200. E.g., the bi-stable flip-flop 200 may be implemented as the SRAM cell 320 (cf. FIG. 3A). The output signal 380 can be a voltage which corresponds to either the high supply voltage VDD applied to the common supply line 150 or the low supply voltage VSS applied to the further common supply line 150a.

At S3, it is checked whether a further readout event is required. At S3, it can be checked whether sufficient statistics is available to determine the value with a sufficient accuracy. Typically, if a larger (smaller) number of readout events is considered when determining the value indicative of the input voltage Vin, the accuracy of the determined value is larger (smaller).

If, at S3, it is determined that a further readout event 700 is required, S1 and S2 are executed anew. Here, it is possible that the preparation event and the readout event 700 of S1 and S2 relate to the same bi-stable flip-flop 200 which has been used to obtain the output signal 380 in the first iteration of S1 and S2. However, it is also possible that S1 and S2 are executed anew employing a further bi-stable flip-flop 200 of another cell 101-1-101-3 of the ADC device 100.

In general, it is also possible that S1, S2 are executed at least partly in parallel for a plurality of bi-stable flip-flops 200 of various cells 101-1-101-3 of the ADC device 100. In such a manner, it is possible to reduce a measurement time required for determining the value indicative of the input voltage Vin. Further, as the statistical evaluation relies on a larger amount of readout events 700, the accuracy of the determining of the value indicative of the input voltage Vin can be increased.

If, at S3, it is determined that no further readout event 700 is required, at S4 the value indicative of the input voltage Vin is determined based on the received output signals 380. The determining of the value can consider the number 600 of readout events 700 across all readout events 700 that correspond to respective bi-stable flip-flop 200 being in a particular one of the operational states 421, 422. A look-up table linking the number 600 with the value may be employed at S4.

Figure 8:
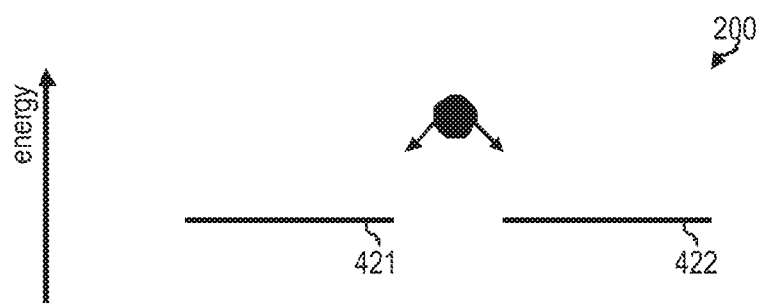
FIG. 8 illustrates schematically two operational states of the bi-stable flip-flop where no asymmetry between first and second branches of the bi-stable flip-flop is present.
Figure 9:
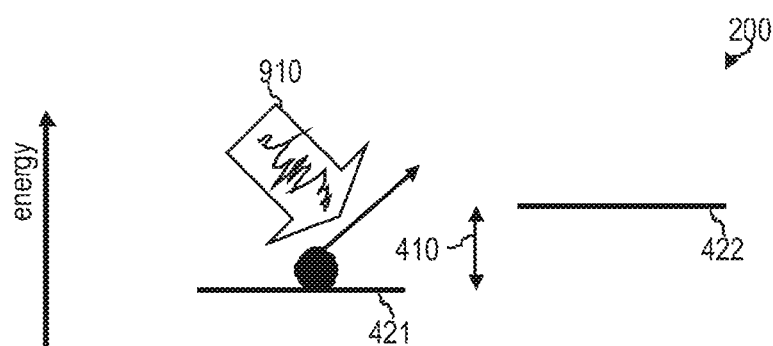
FIG. 9 illustrates schematically the two operational states of the bi-stable flip-flop where an asymmetry between first and second branches of the bi-stable flip-flop is present, wherein FIG. 9 further illustrates the thermal noise.

In FIGS. 8 and 9, the concept of employing thermal noise 910 is schematically illustrated. In FIG. 8, energy levels of the two operational states 421, 422 of the bi-stable flip-flop 200 equal each other. This is because and input voltage Vint is applied which corresponds to a vanishing asymmetry 410. Thus, the bi-stable flip-flop 200 is equally likely to settle in the first operational state 421 as in the second operational state 422. Here, it should be understood that in case a further asymmetry due to manufacturing spread is present, the degeneracy between the first operational state 421 and the second operational state 422 can be lifted.

In FIG. 9, the asymmetry element 250 causes the asymmetry 410. The asymmetry 410 depends on the input voltage Vin. The second operational state 422 is associated with a higher energy, i.e., it is energetically less favourable. In such a scenario, at absolute zero temperature the bi-stable flip-flop 200 would always settle at the first operational state 421. Yet, at finite temperatures 550, thermal noise or thermal activation energy 910 causes a non-zero probability for the bi-stable flip-flop 200 to settle in the second operational state 422.

Figure 10:
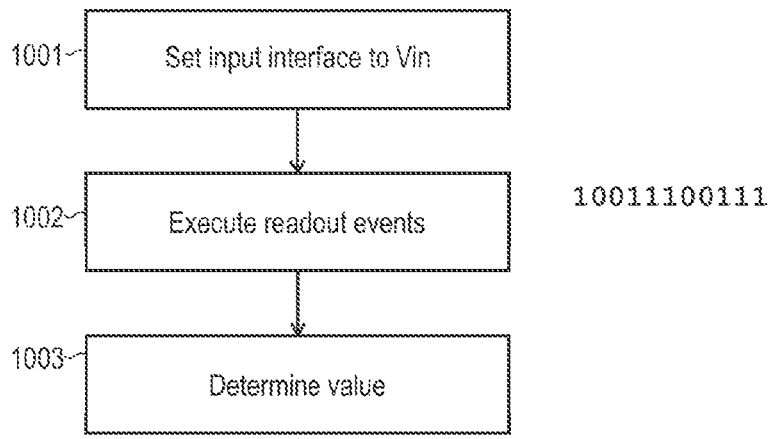
FIG. 10 is a flowchart of a method of determining the value indicative of the input signal according to various embodiments.

In FIG. 10, a flowchart illustrates a method according to various embodiments. At 1001, the input interface 251 receives the input voltage Vin. At 1002, the plurality of readout events 700 are executed. For each one of the plurality of readout events 700, it is denoted whether the respective bi-stable flip-flop 200 has settled in the first operational state 421 or the second operational state 422. From the number 600 of readout events 700 corresponding to a given one of the operational states 421, 422, the value indicative of the input voltage Vin is determined at 1003.

In the scenario of FIG. 10, a calibration is not executed. E.g., this may be due to limited operational ranges of the ADC device 100 in terms of temperature 550. Further, this may be due to a well-known manufacturing spread where there is no need to execute the calibration.

Figure 11:
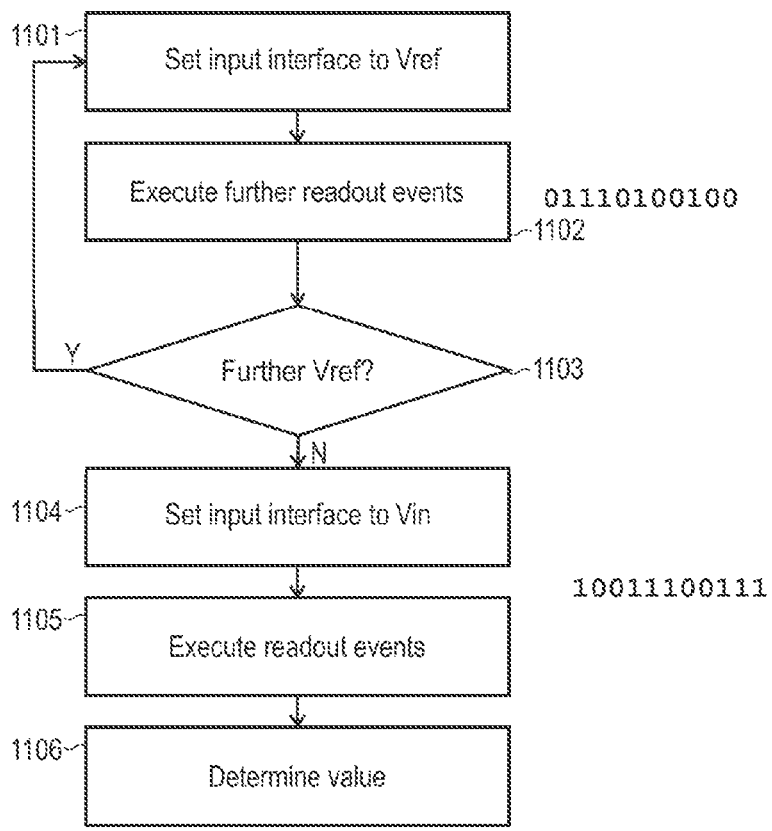
FIG. 11 is a flowchart of a method of determining the value indicative of the input signal according to various embodiments, wherein according to the method illustrated in FIG. 11 one or more reference signals are employed to obtain a reference value.

In FIG. 11, a flowchart of a method according to various embodiments is illustrated that comprises the calibration. From the calibration, and influence of the noise—i.e., thermal noise and/or manufacturing spread—on the output signals 380 of the plurality of readout events 700 may be determined. In other words, it may be possible to determine the particular distribution 400 and the underlying statistics of the plurality of readout events 700 from the calibration.

At 1101, the input interface 251 receives a first reference signal VDD, VSS, Vref. For this, the switch 252 can be operated in a corresponding state. Then, at 1102, a plurality of further readout events are executed. Again, for each one of the plurality of further readout events, it is determined whether the respective bi-stable flip-flop 200 has settled in the first operational state 421 or the second operational state 422.

For example, the reference signal can be a predefined voltage, the high supply voltage VDD or the low supply voltage VSS or a predefined voltage Vref. At 1103, it is checked whether a further one of these reference signals should be provided to the input interface 251 of the asymmetry elements 250. If this is the case, then 1101 and 1102 are executed anew.

Otherwise, at 1104, the input interface 251 is connected to the input line 118 to which the input voltage Vin is applied. 1105, 1106 correspond to 1002, 1003.

A scenario conceivable where only a single reference signal being, e.g., a predefined signal Vref, is required for accurate calibration. This may be the case where the ADC device 100 operates as a single-bit ADC.

Another scenario where only a single reference signal is required for accurate calibration relies on a well-defined manufacturing spread—then, it may only be required to determine the temperature 550, e.g., by applying a predefined signal Vref which causes a well-known asymmetry 410. Then, the temperature 550 can be determined based on the number 600 of further readout events that correspond to a given one of the operational states 421, 422.

A plurality of reference signals may be applied in order to cancel multiple influences of variation such as temperature 550, manufacturing spread, time variation of a power supply, etc.

Generally, it is not required that the calibration is executed for every iteration of 1104, i.e., every time the value indicative of the input voltage Vin is determined. Namely, depending on a time dependency of the noise contribution, it can be sufficient to execute the calibration from time to time.

The following examples set forth some non-limiting examples of combinations of features that may be used.

EXAMPLE 1

A device (100), comprising:
at least one asymmetry element (250) comprising an input interface (251) configured to receive an input signal (Vin),
at least one cell (101-1, 101-2, 101-3), each one of the at least one cell (101-1, 101-2, 101-3) comprising:
  a bi-stable flip-flop (200) comprising a first branch (201-1) and a second branch (201-2), wherein the first branch (201-1) is coupled to the at least one asymmetry element (250) which causes an asymmetry (410) between the first branch (201-1) and the second branch (201-2), the asymmetry (410) between the first branch (201-1) and the second branch (201-2) depending on the input signal (Vin),
  an output interface (105) configured to output an output signal (380) indicative of an operational state (421, 422) of the bi-stable flip-flop (200),
wherein the device (100) further comprises:
  at least one processor (110) configured to receive, from each one of the at least one cell (101-1, 101-2, 101-3) via the output interface (105) of the respective cell (101-1, 101-2, 101-3), the respective output signal (380) in a readout event (700),
wherein the at least one processor (110) is further configured to determine a value indicative of the input signal (Vin) based on the received output signals (380) of a plurality of the readout events (700).

EXAMPLE 2

The device (100) of example 1,
wherein the input interface (251) of the at least one asymmetry element (250) further comprises a switch (252),
wherein the input interface (251) of the at least one asymmetry element (250) is configured to selectively receive the input signal (Vin) or any one of at least one reference signal (Vref, VDD, VSS) depending on a state of the switch (252),
wherein the at least one processor (110) is configured to receive, from each one of the at least one cell (101-1, 101-2, 101-3) via the output interface (105) of the respective cell (101-1, 101-2, 101-3), the respective output signal in the readout event when the switch (252) is in a state where the input interface (251) receives the input signal (Vin),
wherein the at least one processor (110) is configured to receive, from each one of the at least one cell (101-1, 101-2, 101-3) via the output interface (105) of the respective cell (101-1, 101-2, 101-3), a respective further output signal in a further readout event when the switch (252) is in a state where the input interface (251) receives any one of the at least one reference signal (Vref, VDD, VSS),
wherein the at least one processor (110) is further configured to determine the value indicative of the input signal (Vin) further based on the received further output signals of a plurality of the further readout events (700) as a reference value.

EXAMPLE 3

The device (100) of example 2,
wherein the at least one reference signal (Vref, VDD, VSS) comprises at least one of: a positive supply voltage (VDD) of the at least one cell (101-1, 101-2, 101-3); a negative supply voltage (Vss) of the at least one cell (101-1, 101-2, 101-3); a predefined signal (Vref).

EXAMPLE 4

The device (100) of any combination of examples 2 or 3,
wherein the at least one reference signal (Vref, VDD, VSS) comprises a predefined signal,
wherein the at least one processor (110) is configured to determine, based on the received output signals (380) of the plurality of the readout events (700), a first number (600) of output signals (380) which correspond to a given operational state (421, 422) of the bi-stable flip-flops (200) of the at least one cell (101-1, 101-2, 101-3),
wherein the at least one processor (110) is configured to determine, based on the received further output signals of the plurality of the further readout events (700), a second number (600) of further output signals which correspond to the given operational state (421, 422) of the bi-stable flip-flops (200) of the at least one cell (101-1, 101-2, 101-3),
wherein the at least one processor (110) is configured to determine the value indicative of the input signal (Vin) by comparing the first number (600) with the second number (600).

EXAMPLE 5

The device (100) of any combination of examples 2-4,
wherein the at least one processor (110) is configured to determine a noise contribution to the received output signals (380) based on the reference value.

EXAMPLE 6

The device (100) of combination of examples 1-5, further comprising:
a temperature sensor,
wherein the at least one processor (110) is configured to determine a value indicative of a temperature (550) based on a sensor signal received from the temperature sensor,
wherein the at least one processor (110) is further configured to determine the value indicative of the input signal (Vin) further based on the value indicative of the temperature as a reference value.

EXAMPLE 7

The device (100) of any combination of examples 1-6,
wherein the at least one processor (110) is configured to determine, based on the received output signals (380) of the plurality of the readout events (700), a number (600) of output signals (380) which correspond to a given operational state (421, 422) of the bi-stable flip-flops (200) of the at least one cell (101-1, 101-2, 101-3),
wherein the device (100) further comprises a memory configured to store a look-up table, the look-up table including a plurality of links between a candidate number (600) of output signals (380) which correspond to the given operational state (421, 422) and an associated magnitude of the input signal (Vin), wherein the at least one processor (110) is configured to determine the value indicative of the input signal (Vin) by executing a lookup for the determined number (600) of output signals (380) which correspond to the given operational state (421, 422) in the plurality of links of the look-up table.

EXAMPLE 8

The device (100) of any combination of examples 1-7, wherein the at least one processor (110) is configured to determine the value based on a distribution (400) of the operational states (421, 422) indicated by the output signals (380) of the plurality of the readout events (700).

EXAMPLE 9

The device (100) of example 8, wherein the distribution (400) of the operational states (421, 422) is caused by at least one of thermal noise acting on the respective bi-stable flip-flop (200) of the at least one cell (101-1, 101-2, 101-3) at an operation temperature of the device (100) and manufacturing spread of the respective bi-stable flip-flop (200) of the at least one cell (101-1, 101-2, 101-3).

EXAMPLE 10

The device (100) of example 9, wherein the asymmetry element (250) is dimensioned so that the device (100) can be operated in a range of the operation temperature (700) of 70 K to 470 K, preferably 170° C. to 420 K, more preferably 220 K to 370 K.

EXAMPLE 11

The device (100) of any combination of examples 1-10, wherein the asymmetry element (250) is at least one of an Ohmic resistance and a current source.

EXAMPLE 12

The device (100) of any combination of examples 1-11, wherein the device (100) comprises a first number of cells (101-1, 101-2, 101-3),
wherein the device (100) comprises a second number of asymmetry elements (250),
wherein the first number is larger than the second number.

EXAMPLE 13

The device (100) of any combination of examples 1-12, wherein the device (100) further comprises a supply line (115),
wherein the operational state (421, 422) relates to a voltage difference between at least one of the first branch (201-1) and the second branch (201-2) and a supply voltage (VSS, VDD) applied to the supply line (115).

EXAMPLE 14

A method, comprising:
an asymmetry element (250) receiving an input signal (Vin), the asymmetry element (250) being coupled with a first branch (201-1) of a bi-stable flip-flop (200) of at least one cell (101-1, 101-2, 101-3) which causes an asymmetry (410) between the first branch (201-1) and a second branch (201-2) of the bi-stable flip-flop (200), the asymmetry (410) between the first branch (201-1) and the second branch (201-2) depending on the input signal (Vin),
at each one of a plurality of readout events (700): receiving from a respective one of the at least one cell (101-1, 101-2, 101-3) an output signal (380) indicative of an operational state (421, 422) of the respective bi-stable flip-flop (200),
determining a value indicative of the input signal (Vin) based on the received output signals (280) of the plurality of readout events (700).

EXAMPLE 15

The method of claim 14,
wherein the method is executed by the device (100) of any combination of examples 1-13.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

E.g., above primarily scenarios have been discussed where the bi-stable flip-flop has only two operational states. It is likewise possible to employ bi-stable flip-flops which have more than two operational states. Here, depending on the dimension of the asymmetry between the various operational states, the energy difference changes; this may be employed to determine the value indicative of the input signal.

The invention claimed is:
1. A device comprising:
at least one asymmetry element comprising an input interface configured to receive an input signal,
at least one cell, each one of the at least one cell comprising:
a bi-stable flip-flop comprising a first branch and a second branch, wherein the first branch is coupled to the at least one asymmetry element which causes an asymmetry between the first branch and the second branch, the asymmetry between the first branch and the second branch depending on the input signal,
an output interface configured to output an output signal indicative of an operational state of the bi-stable flip-flop,
wherein the device further comprises:
at least one processor configured to receive, from each one of the at least one cell via the output interface of the respective cell, the respective output signal in a readout event,
wherein the at least one processor is further configured to determine a value indicative of the input signal based on the received output signals of a plurality of the readout events.
2. The device of claim 1,
wherein the input interface of the at least one asymmetry element further comprises a switch,
wherein the input interface of the at least one asymmetry element is configured to selectively receive the input signal or any one of at least one reference signal depending on a state of the switch, wherein the at least one processor is configured to receive, from each one of the at least one cell via the output interface of the respective cell, the respective output signal in the readout event when the switch is in a state where the input interface receives the input signal, wherein the at least one processor is configured to receive, from each one of the at least one cell via the output interface of the respective cell, a respective further output signal in a further readout event when the switch is in a state where the input interface receives any one of the at least one reference signal, wherein the at least one processor is further configured to determine the value indicative of the input signal further based on the received further output signals of a plurality of the further readout events as a reference value.

3. The device of claim 2, wherein the at least one reference signal comprises at least one of: a positive supply voltage of the at least one cell; a negative supply voltage of the at least one cell; or a predefined signal.

4. The device of claim 2, wherein the at least one reference signal comprises a predefined signal, wherein the at least one processor is configured to determine, based on the received output signals of the plurality of the readout events, a first number of output signals which correspond to a given operational state of the bi-stable flip-flops of the at least one cell, wherein the at least one processor is configured to determine, based on the received further output signals of the plurality of the further readout events, a second number of further output signals which correspond to the given operational state of the bi-stable flip-flops of the at least one cell, wherein the at least one processor is configured to determine the value indicative of the input signal by comparing the first number with the second number.

5. The device of claim 2, wherein the at least one processor is configured to determine a noise contribution to the received output signals based on the reference value.

6. The device of claim 2, further comprising:

a temperature sensor, wherein the at least one processor is configured to determine a value indicative of a temperature based on a sensor signal received from the temperature sensor, wherein the at least one processor is further configured to determine the value indicative of the input signal further based on the value indicative of the temperature as a reference value.

7. The device of claim 1, wherein the at least one processor is configured to determine, based on the received output signals of the plurality of the readout events, a number of output signals which correspond to a given operational state of the bi-stable flip-flops of the at least one cell, wherein the device further comprises a memory configured to store a look-up table, the look-up table including a plurality of links between a candidate number of output signals which correspond to the given operational state and an associated magnitude of the input signal, wherein the at least one processor is configured to determine the value indicative of the input signal by executing a lookup for the determined number of output signals which correspond to the given operational state in the plurality of links of the look-up table.

8. The device of claim 1, wherein the at least one processor is configured to determine the value based on a distribution of the operational states indicated by the output signals of the plurality of the readout events.

9. The device of claim 8, wherein the distribution of the operational states is caused by at least one of thermal noise acting on the respective bi-stable flip-flop of the at least one cell at an operation temperature of the device and manufacturing spread of the respective bi-stable flip-flop of the at least one cell.

10. The device of claim 9, wherein the asymmetry element is dimensioned so that the device can be operated in a range of the operation temperature of 70 K to 470 K.

11. The device of claim 10, wherein the asymmetry element is dimensioned so that the device can be operated in a range of the operation temperature of 170° C. to 420 K.

12. The device of claim 11, wherein the asymmetry element is dimensioned so that the device can be operated in a range of the operation temperature of 220 K to 370 K.

13. The device of claim 1, wherein the asymmetry element is at least one of an Ohmic resistance and a current source.

14. The device of claim 1, wherein the device comprises a first number of cells, wherein the device comprises a second number of asymmetry elements, wherein the first number is larger than the second number.

15. The device of claim 1, wherein the device further comprises a supply line, wherein the operational state relates to a voltage difference between at least one of the first branch and the second branch and a supply voltage applied to the supply line.

16. A method, comprising:

an asymmetry element receiving an input signal, the asymmetry element being coupled with a first branch of a bi-stable flip-flop of at least one cell which causes an asymmetry between the first branch and a second branch of the bi-stable flip-flop, the asymmetry between the first branch and the second branch depending on the input signal, at each one of a plurality of readout events: receiving from a respective one of the at least one cell an output signal indicative of an operational state of the respective bi-stable flip-flop, determining a value indicative of the input signal based on the received output signals of the plurality of readout events.

* * * * *